United States Patent
Lai et al.

(10) Patent No.: US 8,891,215 B2
(45) Date of Patent: Nov. 18, 2014

(54) HIGH NOISE IMMUNITY WITH LATCH-UP FREE ESD CLAMP

(71) Applicants: Da-Wei Lai, Singapore (SG); Handoko Linewih, Singapore (SG); Ying-Chang Lin, Singapore (SG)

(72) Inventors: Da-Wei Lai, Singapore (SG); Handoko Linewih, Singapore (SG); Ying-Chang Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/711,141

(22) Filed: Dec. 11, 2012

(65) Prior Publication Data
US 2014/0160605 A1    Jun. 12, 2014

(51) Int. Cl.
| | |
|---|---|
| H02H 9/00 | (2006.01) |
| H02H 9/04 | (2006.01) |
| H01C 7/12 | (2006.01) |
| H02H 1/00 | (2006.01) |
| H02H 1/04 | (2006.01) |
| H02H 3/22 | (2006.01) |

(52) U.S. Cl.
CPC ..................... *H02H 9/04* (2013.01)
USPC ............................. 361/56; 361/118

(58) Field of Classification Search
CPC .................................. H01L 27/0248
USPC ........................................... 361/56
See application file for complete search history.

(56) References Cited

U.S. PATENT DOCUMENTS

2008/0259511 A1 *  10/2008  Worley ............................ 361/56

* cited by examiner

*Primary Examiner* — Dharti Patel
(74) *Attorney, Agent, or Firm* — Ditthavong & Steiner, P.C.

(57) ABSTRACT

A triple stack NMOS integrated circuit structure protection circuit for a plurality of terminals operative at respective voltage levels is coupled between the plurality of terminals. First and second NMOS elements of the triple stack NMOS share a common active region. A third NMOS element, vertically positioned with respect to the first and second NMOS elements, has an active region separate from the active region of the first and second NMOS elements. The first, second and third NMOS elements are connected in series between two terminals of the plurality of terminals.

12 Claims, 5 Drawing Sheets

PRIOR ART

PRIOR ART

US 8,891,215 B2

HIGH NOISE IMMUNITY WITH LATCH-UP FREE ESD CLAMP

TECHNICAL FIELD

The present disclosure relates to electrical fast-transient testing involving transient latch-up or system-level electrostatic discharge (ESD).

BACKGROUND

Fast-transient testing is a high noise event that can induce ESD clamp mis-triggering that results in chip function failure. End-products customers, concerned with ESD latchup, seek chips from chip-providers that provide a high electrical fast-transient specification but are reluctant to incur high cost of a printed circuit board (PCB) to solve ESD problems. Traditional attempts to overcome transient latch-up or static latch-up issues involve modification of ESD detection circuits that become more complex in design, requiring more area for a surface-type ESD clamp. FIGS. 1 and 2 illustrate the traditional RC-NMOS ESD clamp and feedback-type RC-NMOS ESD clamp. These circuits provide fast turn-on speed. However, a large chip area is allocated to R and C elements that are required to judge ESD event and normal function.

The IEC-like or transient latch-up testing impact on feedback-type RC-NMOS ESD clamp is shown in FIG. 3. The RC time constant of these circuits can induce false triggering. After $V_{charge}=-4V$ transient latch-up testing, the VDD drops and the IDD increases. This characteristic illustrates that latch-up like occurrences can happen on this ESD clamp during electrical fast-transient testing, such as transient latch-up testing IEC-like testing. Moreover, both the traditional RC-ESD clamp and feedback-type RC-NMOS ESD clamp can incur high noise damping or transient latch-up testing.

FIG. 4 is a modified RC-Clamp circuit. As in other type of RC-clamp circuits, it is the size of the clamping device that is usually large, in thousands of um width device. In a RC-Clamp circuit, the clamp device represents a high impedance to the circuit in normal operating condition or up to the clamp device trigger voltage (Vtl). The clamp device (or sometimes called ESD clamping device) in RC-clamp circuitry is an active device. The transient detection circuit controls the conduction of the active device. During an ESD event, the transient detection circuit will drive (bias the gate) of the active device and turn it on, i.e. become a low impedance acting as a discharge path in surface mode. The parasitic BJT (NPN in case of NMOS active device) can be further triggered on and provide another path, as the ESD signal pass/over the active device trigger voltage (Vtl).

RC-clamp circuit as an ESD device is a non-snapback device. However other ESD devices such as gate grounded NMOS, SCR and lateral NPN do have snapback characteristic.

The root cause inducing transient latch-up of RC-ESD clamp and false-triggering under electrical fast-transient testing is the RC elements. How to provide an ESD clamp with small size and high noise immunity such as transient latch-up, static latch-up free ESD clamp, becomes a more critical consideration in the development of high voltage technology.

An ESD snap-back device, once conducting current, will exhibit "snap-back" or negative resistance characteristics due to its structure. During normal operation, the ESD device represents a high impedance to the circuit up to the ESD device trigger voltage. During an ESD event, the trigger voltage will be exceeded and the ESD device will begin to conduct and enter a low impedance state. This point is defined on the curve, shown in FIG. 5, by the snap-back holding voltage (Vh) and snap-back holding current (Ih). To return to a non-conducting state, the current through the device must fall below the Ih and the voltage must fall below the Vh.

For the ESD device to be immune to static and transient latch-up, its snap-back holding voltage must be within the ESD protection windows, i.e., between supply rail voltage (VDD) and the core device breakdown voltage, as illustrated in FIG. 6. Static latch-up is an event that occurs when the clamp device becomes conductive due to lower snap-back holding voltage of the clamp device or fluctuation of the supply voltage rail (VDD). Transient latch-up is an event that occurs when the clamp device becomes conductive as a result of spikes, noise, or a start-up transient on the supply rail.

One general approach to overcome transient latch-up or static latch-up is to provide a non-snapback characteristic of ESD clamp, such as PMOS or lateral PNP. Such a device will impact on chip size due to low β compared to NMOS. In general, PMOS needs 2~3 times the area compared to an NMOS device for a given ESD performance. Another approach is the use of PMOS or lateral PNP architecture to obtain a non-snapback characteristic. Such an arrangement encompasses a large size, approximately two to three times the area compared to NMOS architecture, and large on resistance (Ron). Surface mode PMOS with transient latch-up free ESD detection circuits is an attractive approach to solve transient or static latch-up issues, but incurs high area cost.

A need therefore exists for an improved ESD power clamp or I/O pad clamp that can be used as an electrical fast-transient whole-chip protection network. Such a device should be effective for application to maturing technology as such technology advances. An additional needed benefit would be a cost reduction of saved chip area.

SUMMARY

The needs described above are fulfilled, at least in part, by provision of a triple stack NMOS integrated circuit structure protection circuit for a plurality of terminals operative at respective voltage levels, the protection circuit being coupled between the plurality of terminals. First and second NMOS elements of the triple stack NMOS structure are positioned generally vertically with respect to each other below a surface of the integrated circuit structure. The first and second NMOS elements share a common active region. A third NMOS element is vertically positioned with respect to the first and second NMOS elements, the third NMOS element having an active region separate from the active region of the first and second NMOS elements. The first, second and third NMOS elements are connected in series between two terminals of the plurality of terminals.

The triple stack NMOS protection circuit is applicable with respect to input and output terminals of an integrated circuit structure as well as to logic circuit terminals. Gates of the first, second and third NMOS elements may be tied to ground. A gate of a first NMOS element of the two NMOS elements may be connected to a gate of the third NMOS element while a gate of a second NMOS element of the two NMOS elements is coupled to a voltage supply potential. The triple stack NMOS protection structure avoids the occurrence of snapback because of the absence of resistive and capacitive elements that would incur a circuit RC time constant. The holding voltage of the triple stack NMOS integrated circuit structure can thus be set to a trigger voltage of the triple stack NMOS integrated circuit structure at a level that is higher than the operating voltage of the circuit to be protected. The circuit is thus immune to lath-up events.

Additional advantages of the present disclosure will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Various exemplary embodiments are illustrated by way of example, and not by way of limitation, in the figures of the accompanying drawings in which like reference numerals refer to similar elements and in which.

DETAILED DESCRIPTION

Figure 1:
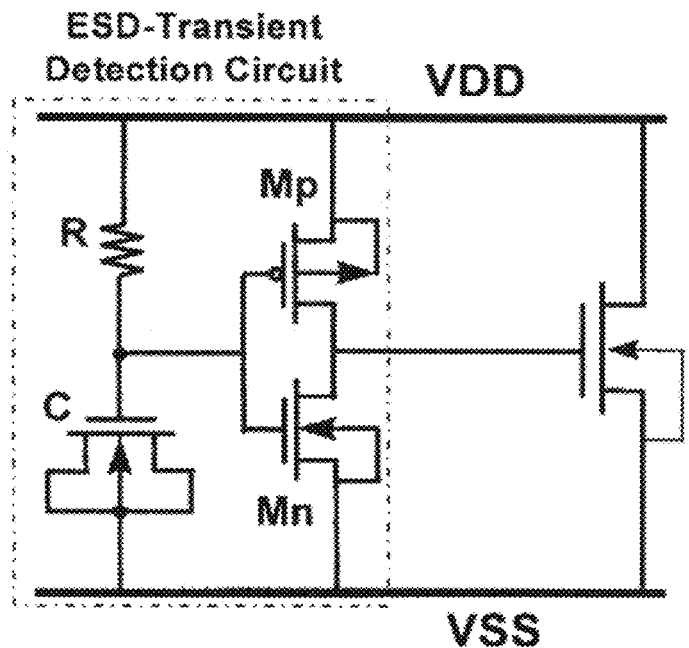
FIGS. 1 and 2 are circuit diagrams of traditional RC-triggered ESD power clamps.
Figure 2:
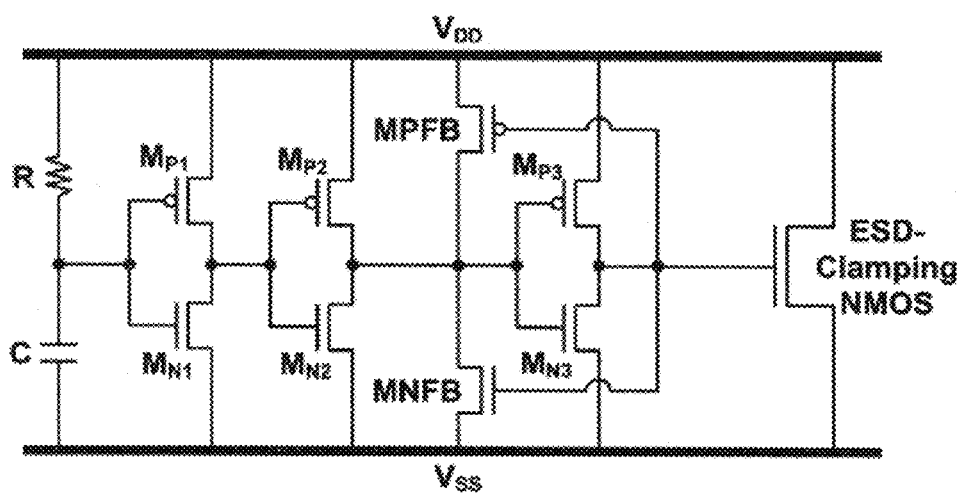
Figure 3:
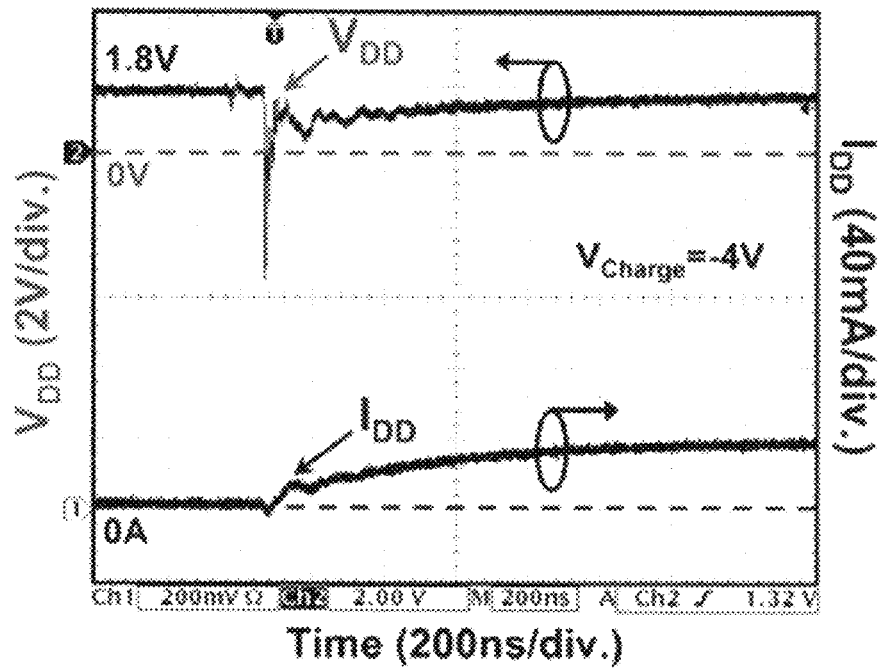
FIG. 3 is a graphic representation of transient latch-up testing impact on feedback-type RC-NMOS ESD clamps shown in FIGS. 1 and 2.
Figure 4:
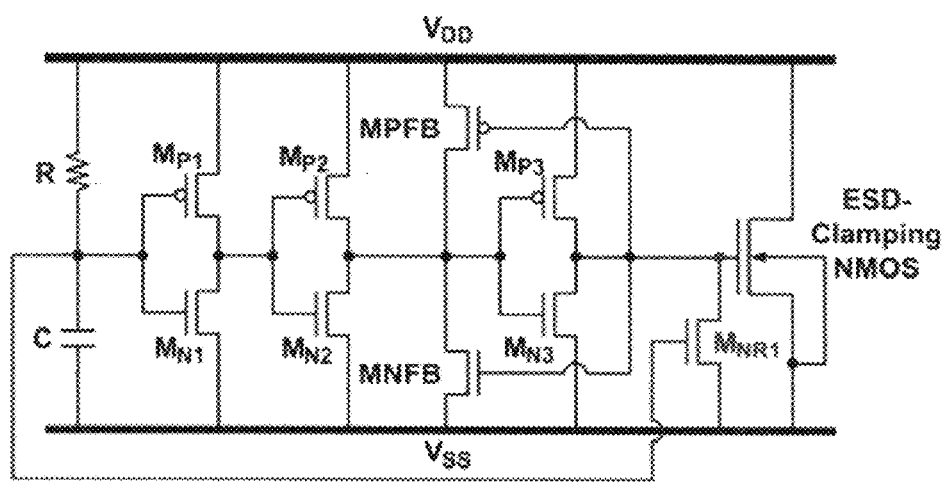
FIG. 4 is a circuit diagram of a prior art modification of the circuit of FIG. 2.
Figure 5:
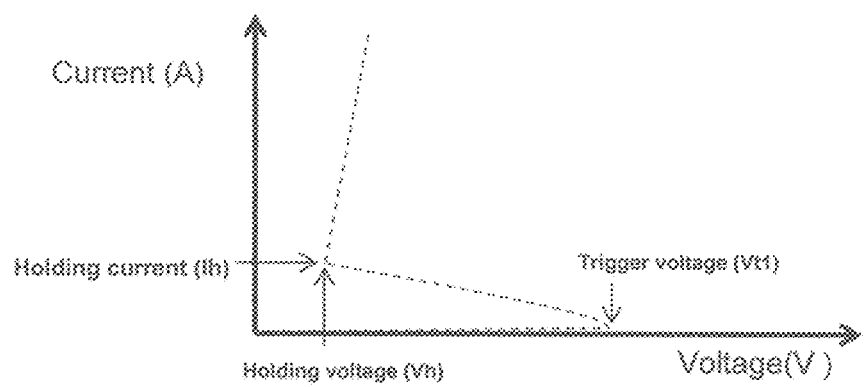
FIG. 5 is a graphic representation of snap-back holding voltage (Vh) and snap-back holding current (Ih) of a snap-back ESD clamp.
Figure 6:
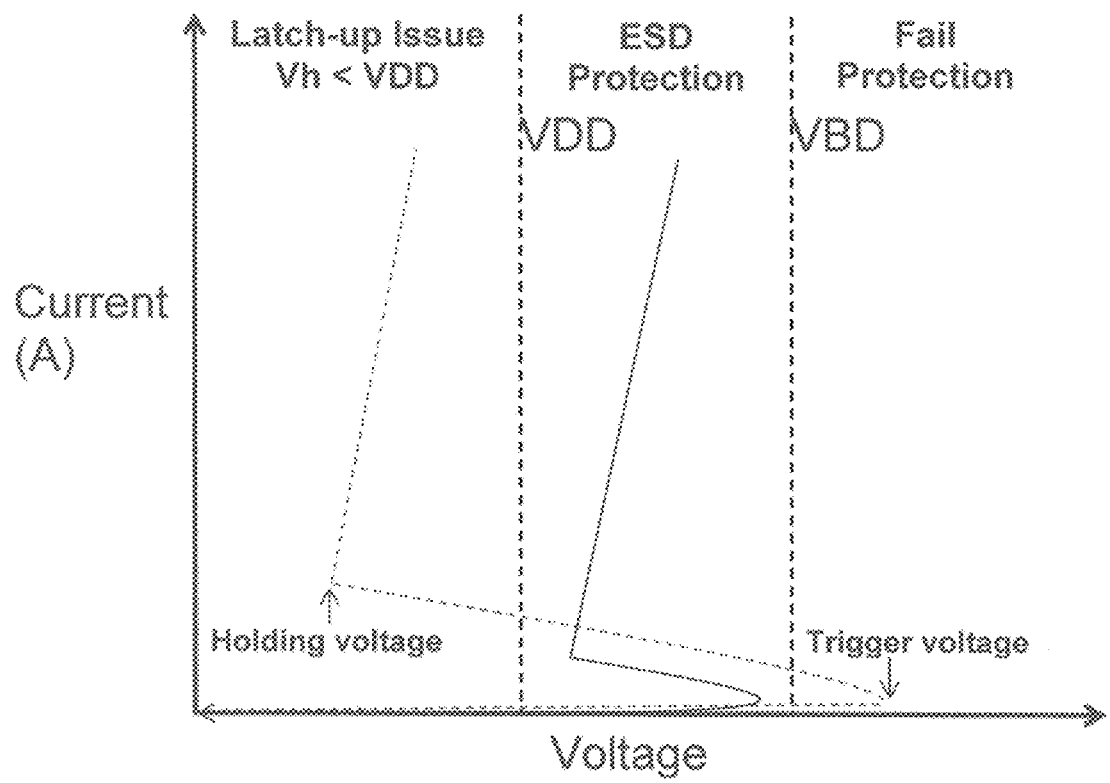
FIG. 6 is a graphic representation of voltage and current levels and the ESD protection windows, i.e., between supply rail voltage (VDD) and the core device breakdown voltage, of a snap-back ESD clamp.
Figure 7:
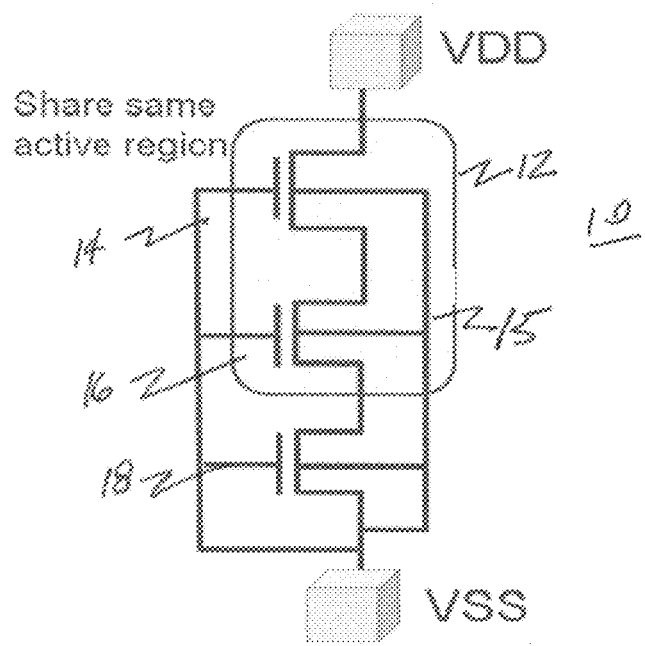
FIG. 7 is an exemplified circuit diagram of a power clamp in accordance with the present disclosure.

FIG. 7 is illustrative of an ESD clamp circuit 10 of the present disclosure that may connected across voltage supply rails VDD and VSS to protect a relatively high voltage integrated circuit. A first cell, or module, 12 comprises NMOS elements 14 and 16 that share the same active region 15. A lower NMOS element 18 does not share active region 15. The poly gates of elements 14, 16 and 18 are tied to ground. NMOS elements 14, 16 and 18 are connected in series circuit between supply rails VDD and VSS. The triple stack NMOS FET structure increases holding voltage capability compared with RC-ESD clamp arrangements. This higher holding voltage is in close range of the clamp circuit trigger voltage. The arrangement of FIG. 7 creates multi-directional fields from anode to cathode. Multiple paths are thus provided for avalanche generated substrate currents, which lower the effective substrate resistance for triggering parasitic transistors. The ESD performance can be improved by controlling the second gate with biasing under ESD testing.

Figure 8:
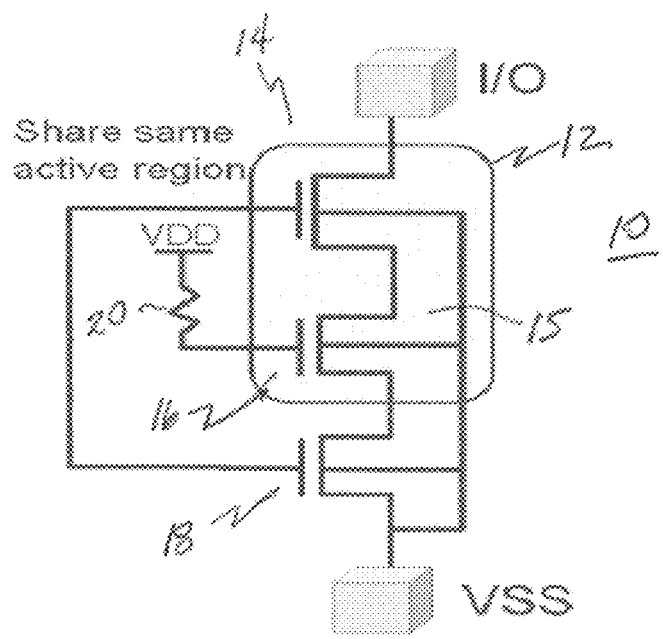
FIG. 8 is another exemplified circuit diagram of a power clamp in accordance with the present disclosure.

FIG. 8 is illustrative of ESD clamp circuit 10 in use for protection of I/O pads, for example, in logic devices. NMOS elements 14, 16 and 18 are connected in series circuit between an input/output terminal I/O and supply terminal VSS. Module 12 comprises NMOS elements 14 and 16 that share the same active region 15. Lower NMOS element 18 does not share active region 15. The gates of NMOS elements 14 and 18 are connected together, while the gate of NMOS element 16 is connected to supply terminal VDD via resistor 20.

Figure 9:
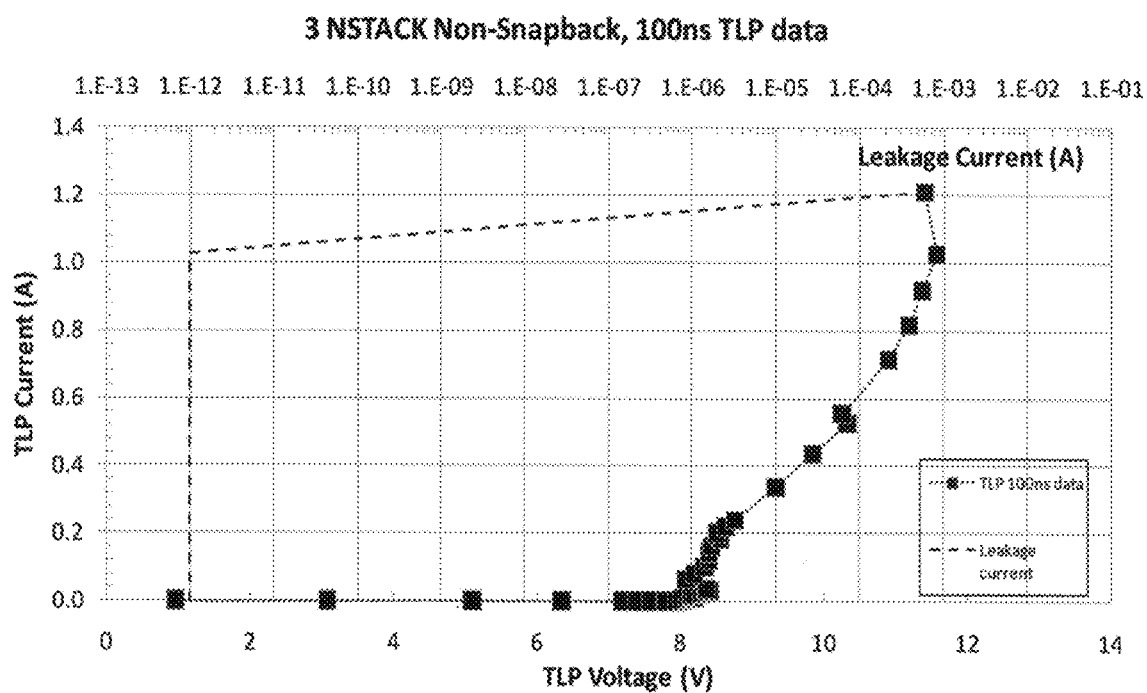
FIG. 9 is an exemplified graphic representation transmission line pulsing voltage and current characteristics of the power clamps of FIGS. 7 and 8.

FIG. 9 represents transmission line pulsing voltage and current characteristics of the power clamps of FIGS. 7 and 8. As can be seen, there is no snap-back characteristic as the clamp holding voltage is substantially the same as the trigger voltage. As a result, there is no transient latch-up or static latch-up problem either in logic circuit usage or with high voltage technology. The trigger voltage can be decreased further by adding a resistor between poly gate and ground.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, the disclosed triple stack NMOS clamp can be extended for use with advancement of technology such as logic, and HV processes. The triple stack NMOS clamp arrangement can be used as an ESD power clamp or I/O pad clamp in combination, and as an electrical fast-transient whole-chip protection network.

What is claimed is:

1. A method comprising:
   providing a protection circuit for a plurality of terminals operative at respective voltage levels comprising:
   forming a triple stack NMOS integrated circuit structure; and
   coupling the protection circuit between the plurality of terminals; wherein the providing step comprises:
   forming two NMOS elements vertically with respect to each other below a surface of the integrated circuit structure, said two NMOS elements sharing a common active region;
   forming a third NMOS element vertically with respect to said two NMOS elements, the third NMOS element having an active region separate from the active region of said two NMOS elements and
   directly connecting gates of the two NMOS elements and the third NMOS element to ground.

2. The method as recited in claim 1, wherein the step of coupling comprises forming a series electrical connection of the two NMOS elements and the third NMOS element between two terminals of the plurality of terminals.

3. The method as recited in claim 2, wherein the two terminals comprise input and output terminals of an integrated circuit structure.

4. The method as recited in claim 1, further comprising connecting a gate of a first NMOS element of the two NMOS elements to a gate of the third NMOS element and coupling a gate of a second NMOS element of the two NMOS elements to a voltage supply potential.

5. The method as recited in claim 1, wherein the two terminals comprise logic circuit terminals.

6. The method as recited in claim 1, further comprising setting a holding voltage of the triple stack NMOS integrated circuit structure to a trigger voltage of the triple stack NMOS integrated circuit structure.

7. A device comprising:
   a protection circuit for a plurality of terminals operative at respective voltage levels, the protection circuit comprising a triple stack NMOS integrated circuit structure, the protection circuit coupled between the plurality of terminals;

wherein first and second NMOS elements of the triple stack NMOS structure are positioned vertically with respect to each other below a surface of the integrated circuit structure and the first and second NMOS elements share a common active region; and the triple stack NMOS structure further comprises a third NMOS element vertically positioned with respect to the first and second NMOS elements, the third NMOS element having an active region separate from the active region of said two NMOS elements, and gates of the first, second and third NMOS elements are each directly connected to ground.

8. The device as recited in claim 7, wherein the first, second and third NMOS elements are connected in series between two terminals of the plurality of terminals.

9. The device as recited in claim 7, wherein the two terminals comprise input and output terminals of an integrated circuit structure.

10. The device as recited in claim 7, wherein the two terminals comprise logic circuit terminals.

11. The device as recited in claim 7, wherein a gate of a first NMOS element of the two NMOS elements is connected to a gate of the third NMOS element and a gate of a second NMOS element of the two NMOS elements is coupled to a voltage supply potential.

12. The device as recited in claim 7, wherein a holding voltage of the triple stack NMOS integrated circuit structure corresponds to a trigger voltage of the triple stack NMOS integrated circuit structure.

* * * * *